US008969957B2

(12) United States Patent
Ito et al.

(10) Patent No.: US 8,969,957 B2
(45) Date of Patent: Mar. 3, 2015

(54) LDMOS ONE-TIME PROGRAMMABLE DEVICE

(71) Applicant: Broadcom Corporation, Irvine, CA (US)

(72) Inventors: Akira Ito, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/945,739

(22) Filed: Jul. 18, 2013

(65) Prior Publication Data

US 2013/0299904 A1     Nov. 14, 2013

Related U.S. Application Data

(63) Continuation of application No. 13/252,880, filed on Oct. 4, 2011, now Pat. No. 8,493,767.

(51) Int. Cl.
*H01L 21/70* (2006.01)
*H01L 23/52* (2006.01)
(Continued)

(52) U.S. Cl.
CPC ...... *H01L 29/7816* (2013.01); *H01L 27/11206* (2013.01); *H01L 23/5252* (2013.01);
(Continued)

(58) Field of Classification Search
CPC .............. H01L 27/11206; H01L 23/5252; H01L 27/088; H01L 29/7816; H01L 29/66681; H01L 27/1124; H01L 27/11246; H01L 27/11266; H01L 27/11226; H01L 29/495; H01L 29/4966; H01L 29/517; H01L 29/7835
USPC ....................... 257/2, 3, 4, 338, 368, 529, 530
See application file for complete search history.

(56) References Cited

U.S. PATENT DOCUMENTS 5,909,049 A * 6/1999 McCollum ................ 257/530
2005/0258461 A1 11/2005 Wang
(Continued)

FOREIGN PATENT DOCUMENTS

CN 101609834 A 12/2009

OTHER PUBLICATIONS

Office Action issued on Aug. 26, 2014 in Taiwanese Application No. 101133331. (8 pages).
(Continued)

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a one-time programmable (OTP) device having a lateral diffused metal-oxide-semiconductor (LDMOS) structure comprises a pass gate including a pass gate electrode and a pass gate dielectric, and a programming gate including a programming gate electrode and a programming gate dielectric. The programming gate is spaced from the pass gate by a drain extension region of the LDMOS structure. The LDMOS structure provides protection for the pass gate when a programming voltage for rupturing the programming gate dielectric is applied to the programming gate electrode. A method for producing such an OTP device comprises forming a drain extension region, fabricating a pass gate over a first portion of the drain extension region, and fabricating a programming gate over a second portion of the drain extension region.

21 Claims, 4 Drawing Sheets

(51) Int. Cl.
*H01L 29/78* (2006.01)
*H01L 27/112* (2006.01)
*H01L 23/525* (2006.01)
*H01L 27/088* (2006.01)
*H01L 29/66* (2006.01)
*H01L 21/762* (2006.01)
*H01L 29/49* (2006.01)
*H01L 29/51* (2006.01)

(52) U.S. Cl.
CPC ........ *H01L27/088* (2013.01); *H01L 29/66681* (2013.01); *H01L 21/76224* (2013.01); *H01L 29/495* (2013.01); *H01L 29/4966* (2013.01); *H01L 29/517* (2013.01); *H01L 29/7835* (2013.01); *H01L 27/11226* (2013.01); *H01L 27/1124* (2013.01); *H01L 27/11246* (2013.01); *H01L 27/11266* (2013.01)
USPC .......................... 257/338; 257/529; 257/530

(56) References Cited

U.S. PATENT DOCUMENTS

| | | |
|---|---|---|
| 2006/0046354 A1 | 3/2006 | Kreipl |
| 2009/0224325 A1* | 9/2009 | Min et al. ............... 257/355 |
| 2009/0315109 A1 | 12/2009 | Kim |
| 2010/0073985 A1 | 3/2010 | Lai et al. |
| 2010/0320561 A1* | 12/2010 | Xia et al. ............... 257/529 |

OTHER PUBLICATIONS

Chinese Office Action issued Nov. 28, 2014, in Chinese Application No. 201210371702.1 (6 pages).

* cited by examiner

LDMOS ONE-TIME PROGRAMMABLE DEVICE

This is a continuation of application Ser. No. 13/252,880 filed Oct. 4, 2011.

BACKGROUND OF THE INVENTION

1. Field of the Invention

The present invention is generally in the field of semiconductors. More particularly, the present invention is in the field of one-time programmable semiconductor devices.

2. Background Art

One-time programmable (OTP) devices are used throughout the semiconductor industry to allow for post-fabrication design changes in integrated circuits (ICs). For example, after post-fabrication functionality testing but before sale to a customer, a semiconductor device manufacturer can program a network of OTP devices embedded in a particular semiconductor die to provide a permanent serial number encoding for that particular die. Under other circumstances, a single OTP device can be programmed to permanently enable or disable a portion of an integrated circuit at any time after fabrication, including after sale to a customer. Although this functionality is in great demand, conventional OTP elements (the programmable constituent of an OTP device) can be larger than desired or can require multiple additional fabrication steps beyond those required for conventional transistor fabrication, for example, making conventional OTP devices expensive to manufacture and embed.

One such conventional embedded OTP device can be fabricated using the so-called split-channel approach, where an atypical metal-oxide-semiconductor field-effect transistor (MOSFET) fabrication process is used to form a gate structure comprising a single channel interface with two different gate dielectric thicknesses. The thin portion of gate dielectric (the OTP element) can be made to destructively break down and form a conductive path from gate to channel, thereby switching the conventional OTP device into a "programmed" state. This approach, however, has a relatively high tendency to result in devices with programmed states where the remaining thick gate structure exhibits a high leakage current due to collateral damage during programming. In addition, this approach tends to render devices with relatively poorly differentiated programmed and un-programmed states (as seen by a sensing circuit), which, in combination with the high leakage current statistics, require a relatively high voltage sensing circuit to reliably read out programmed and un-programmed states. Mitigation of these shortcomings can require additional die space for high-voltage sensing circuitry and/or for redundancy techniques, for example, which can involve undesirable increases in manufacturing cost.

Thus, there is a need to overcome the drawbacks and deficiencies in the art by providing a reliable OTP device that is both robust against damage during programming and capable of being fabricated using existing MOSFET fabrication process steps.

SUMMARY OF THE INVENTION

A one-time programmable (OTP) device having a lateral diffused metal-oxide-semiconductor (LDMOS) structure and related method, substantially as shown in and/or described in connection with at least one of the figures, and as set forth more completely in the claims.

DETAILED DESCRIPTION OF THE INVENTION

Figure 1:
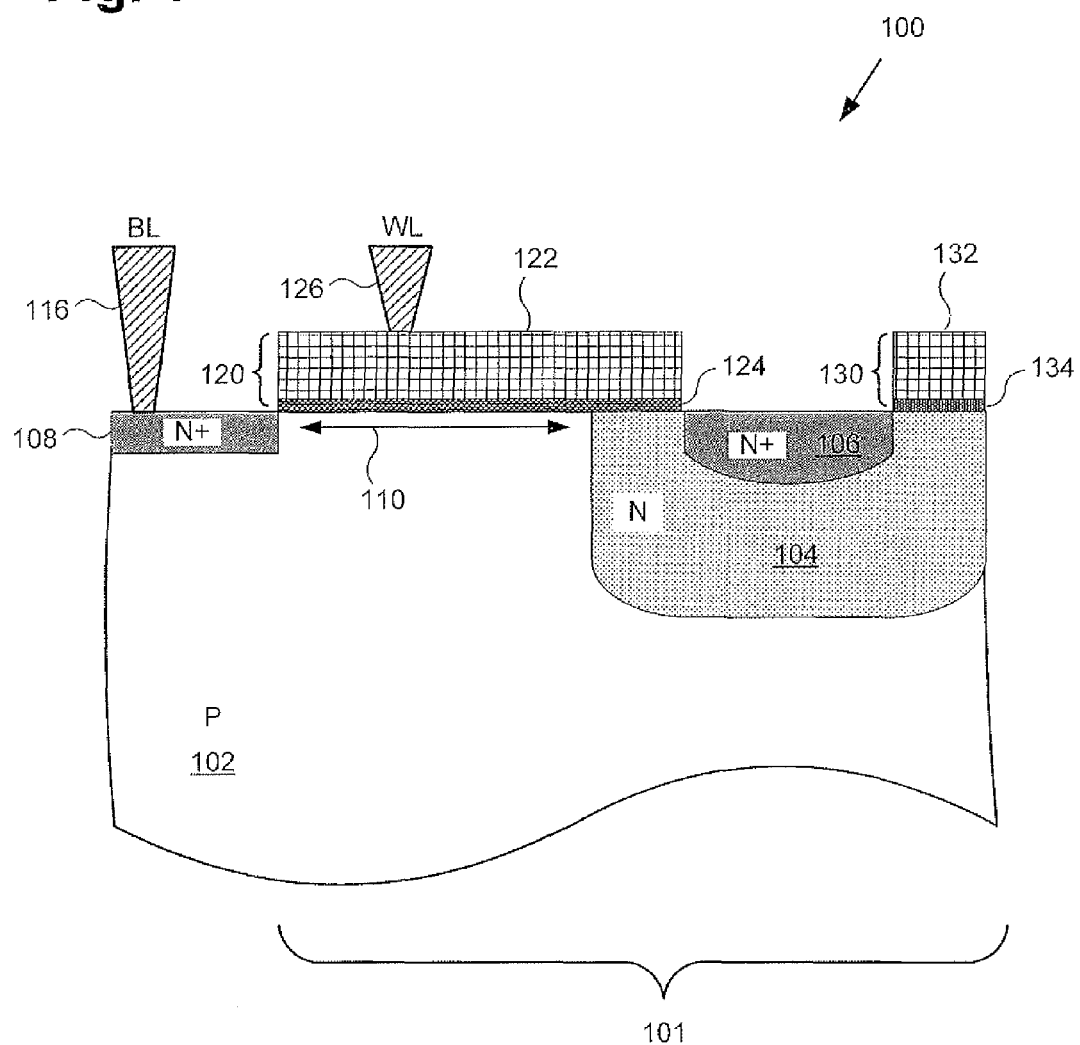
FIG. 1 shows a one-time programmable (OTP) device having a lateral diffused metal-oxide-semiconductor (LDMOS) structure, prior to programming, according to one embodiment of the present invention.

The present invention is directed to a one-time programmable (OTP) device having a lateral diffused metal-oxide-semiconductor (LDMOS) structure and related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of OTP device 100 having LDMOS structure 101, according to one embodiment of the present invention, capable of overcoming the drawbacks and deficiencies associated with the conventional art. OTP device 100, which is represented as an n-channel metal-oxide-semiconductor (NMOS) device in FIG. 1, can be fabricated in P type semiconductor body 102, which may comprise a portion of a Group IV semiconductor wafer or die, such as a wafer or die comprising silicon or germanium, for example. Semiconductor body 102 may include N type drain extension region 104, heavily doped N+ drain region 106, and heavily doped N+ source region 108. As shown in FIG. 1, OTP device 100 may comprise pass gate 120 including pass gate electrode 122 and pass gate dielectric 124, and programming gate 130 including programming gate electrode 132 and programming gate dielectric 134. As further shown in FIG. 1, pass gate 120 is formed over channel region 110 of semiconductor body, while programming gate 130 is spaced from pass gate 120 by a portion of drain extension region 104. Also shown in FIG. 1 are bit line contact 116 formed over heavily doped source region 108 and word line contact 126 formed over pass gate 120.

Due at least in part to its adoption of LDMOS structure 101, OTP device 100 is configured to have enhanced programming reliability while concurrently providing protection for pass gate 120 when a programming voltage for rupturing programming gate dielectric 134 is applied to programming gate electrode 132. In addition, programming gate 130 may be fabricated using a high-κ metal gate process, such that, after programming, a Schottky contact is formed between programming gate electrode 132 and drain extension region 104, thereby enabling better conduction in a forward biased state. Moreover, because fabrication of OTP device 100 can be performed using processing steps presently included in many complementary metal-oxide-semiconductor (CMOS) foundry process flows, such as a high-κ metal gate CMOS process flow, for example, OTP device 100 may be fabricated alongside conventional CMOS devices, and may be monolithically integrated with CMOS logic, for example, in an integrated circuit (IC) fabricated on a semiconductor wafer or die.

It is noted that the specific features represented in FIG. 1 are provided as part of an example implementation of the present inventive principles, and are shown with such specificity as an aid to conceptual clarity. Because of the emphasis on conceptual clarity, it is reiterated that the structures and features depicted in FIG. 1, as well as in FIGS. 2 and 4, may not be drawn to scale. Furthermore, it is noted that particular details such as the type of semiconductor device represented by OTP device 100, its overall layout, its channel conductivity type, and the particular dimensions attributed to its features are merely being provided as examples, and should not be interpreted as limitations. For example, although the embodiment shown in FIG. 1 characterizes OTP device 100 as an NMOS device, more generally, an OTP device according to the present inventive principles can comprise an n-channel or p-channel MOSFET, and thus may be implemented as a PMOS device, as well as the example NMOS device shown specifically as OTP device 100, in FIG. 1.

Figure 2:
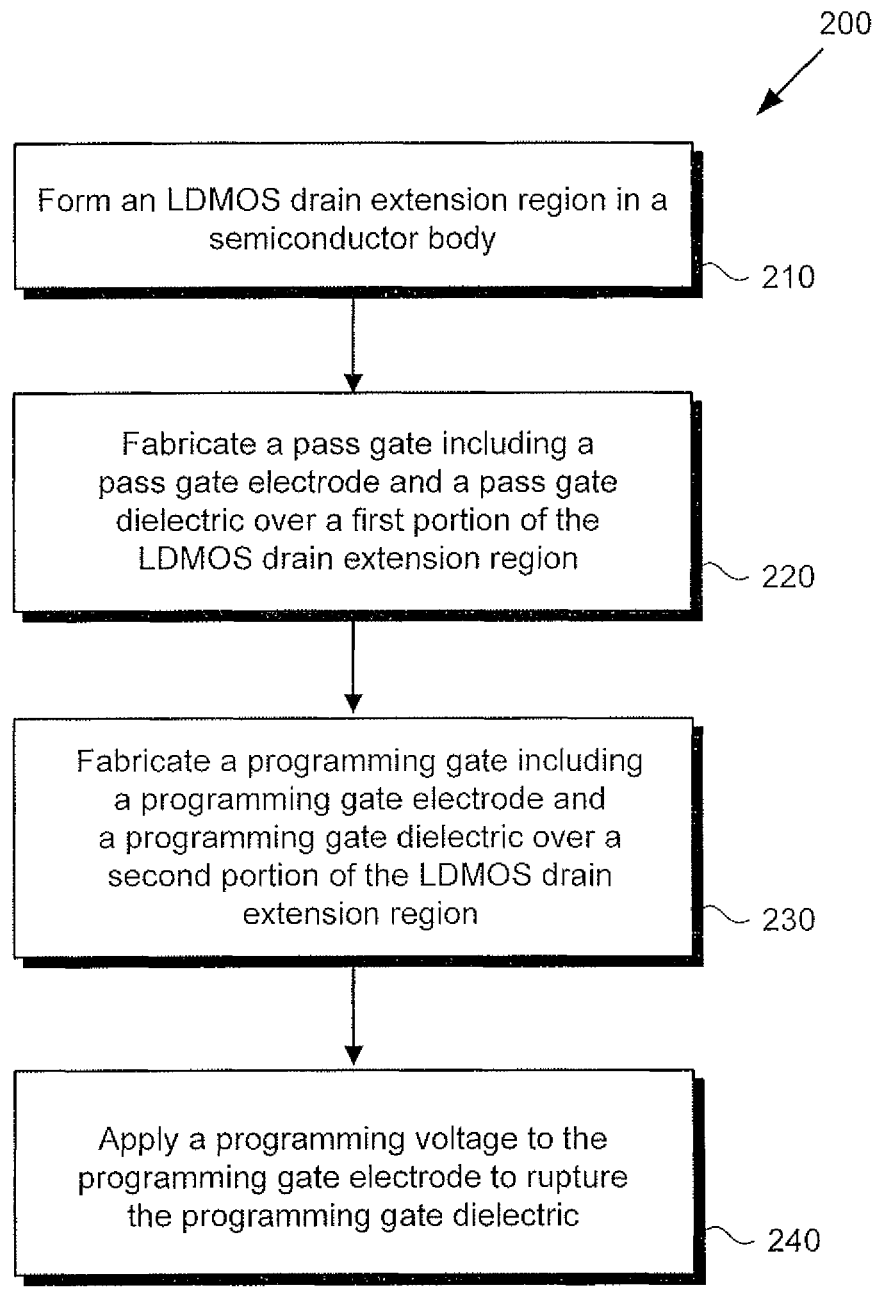
FIG. 2 is a flowchart showing a method for producing an OTP device having an LDMOS structure, according to one embodiment of the present invention.
Figure 3:
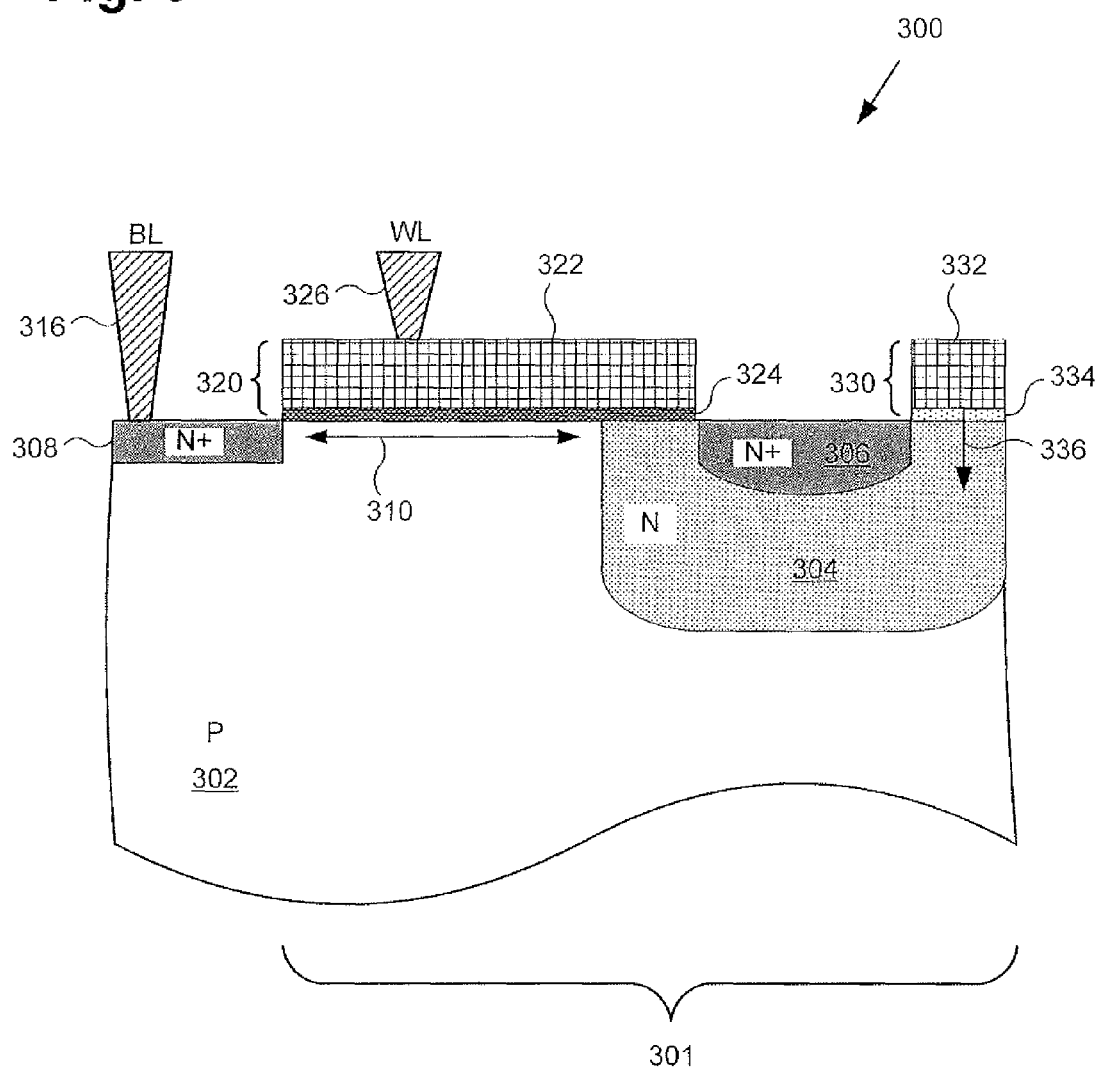
FIG. 3 shows the OTP device of FIG. 1 after application of a programming voltage, according to one embodiment of the present invention.

Some of the features and advantages of OTP device 100 having LDMOS structure 101 will be further described in combination with FIGS. 2 and 3. FIG. 2 shows flowchart 200 presenting one embodiment of a method for producing an OTP device having an LDMOS structure, while FIG. 3 shows OTP device 300 corresponding to OTP device 100, in FIG. 1, after programming, according to one embodiment of the present invention. With respect to flowchart 200, in FIG. 2, it is noted that certain details and features have been left out of flowchart 200 that are apparent to a person of ordinary skill in the art. For example, a step may comprise one or more substeps or may involve specialized equipment or materials, as known in the art. While steps 210 through 240 indicated in flowchart 200 are sufficient to describe one embodiment of the present invention, other embodiments of the present invention may utilize steps different from those shown in flowchart 200, or may comprise more, or fewer, steps.

Referring to step 210 in FIG. 2 and OTP device 100 in FIG. 1, step 210 of flowchart 200 comprises forming drain extension region 104 of LDMOS structure 101. In one embodiment, step 210 may correspond to implanting drain extension region 104 by performing a retrograde implant of dopants into semiconductor body 102. As previously mentioned, in some embodiments, the fabrication method of flowchart 200 may be implemented using existing CMOS fabrication process flows. For example, in one embodiment, OTP device 100 having LDMOS structure 101 may be fabricated on a wafer concurrently undergoing CMOS logic fabrication. Thus, in such embodiments, step 210 may correspond to implanting drain extension region 104 by performing one of a Core Well implant or an JO Well implant procedure, as known in the art.

Moving to step 220 in FIG. 2 and continuing to refer to OTP device 100, in FIG. 1, step 220 of flowchart 200 comprises fabricating pass gate 120 including pass gate electrode 122 and pass gate dielectric 124 over a first portion of drain extension region 104. As shown in FIG. 1, pass gate 120 including pass gate electrode 122 and pass gate dielectric 124 is situated over channel region 110 and a first portion of drain extension region 104 disposed between channel region 110 and heavily doped drain region 106. Pass gate dielectric 124 can be, for example, a high dielectric constant (high-κ) gate dielectric layer (e.g. a high-κ dielectric layer that can be utilized for forming an NMOS or PMOS gate dielectric). In such an embodiment, high-κ pass gate dielectric 124 can comprise, for example, a metal oxide such as hafnium oxide ($HfO_2$), zirconium oxide ($ZrO_2$), or the like. When implemented as a high-κ dielectric, pass gate dielectric 124 can be formed, for example, by depositing a high-κ dielectric material, such as $HfO_2$ or $ZrO_2$, over semiconductor body 102 by utilizing a physical vapor deposition (PVD) process, a chemical vapor deposition (CVD) process, or other suitable process, such as atomic layer deposition (ALD) or molecular beam epitaxy (MBE), for example.

Pass gate electrode 122 may comprise a gate metal. For example, in embodiments in which OTP device 100 is implemented as an NMOS device, as shown in FIG. 1, pass gate electrode 122 may he formed from any gate metal suitable for use in an NMOS device, such as tantalum (Ta), tantalum nitride (TaN), or titanium nitride (TiN), for example. Moreover, in embodiments in which OTP device 100 is implemented as a PMOS device, pass gate electrode 122 may be formed from any gate metal suitable for use in a PMOS device, such as molybdenum (Mo), ruthenium (Ru), or tantalum carbide nitride (TaCN), for example. A gate metal provided over pass gate dielectric 124 to produce pass gate electrode 122 can be formed using any of PVD, CVD, ALD, or MBE, for example.

Continuing to step 230 in FIG. 2, step 230 of flowchart 200 comprises fabricating programming gate 130 including programming gate electrode 132 and programming gate dielectric 134 over a second portion of drain extension region 104. As shown in FIG. 1, programming gate 130 including programming gate electrode 132 and programming gate dielectric 134 does not adjoin pass gate 120, but rather is situated adjacent pass gate 120 over a second portion of drain extension region 104 spaced apart from the first portion of drain extension region 104 over which pass gate 120 is disposed.

According to one embodiment, pass gate 120 and programming gate 130 can be fabricated substantially concurrently. That is to say, steps 220 and 230 of flowchart 200 may be performed concurrently. Moreover, pass gate 120 and programming gate 130 may be formed using substantially the same materials. In other words, pass gate dielectric 124 and programming gate dielectric 134 can comprise the same dielectric material, such as the same high-κ dielectric material, while pass gate electrode 122 and programming gate electrode 132 can comprise the same electrically conductive material, such as the same gate metal. Thus, as was the case for fabrication of pass gate 120 in step 220, fabrication of programming gate 130 can be performed using a high-κ dielectric as programming gate dielectric 134, such as $HfO_2$ or $ZrO_2$, and using a metal gate comprised of Ta, TaN, TiN, Mo, Ru, or TaCN, for example, to implement programming gate electrode 132. Moreover, programming gate 130, like pass gate 120 can be formed using any suitable process, such as PVD, CVD, ALD, or MBE, for example.

Moving to step 240 in FIG. 2, step 240 of flowchart 200 comprises applying a programming voltage to programming gate electrode 132 to rupture programming gate dielectric 134. The result of performing step 240 of flowchart 200 on OTP device 100, in FIG. 1, is shown in FIG. 3, which presents a cross-sectional view of OTP device 300 having LDMOS structure 301.

OTP device 300 is shown to include N type drain extension region 304, heavily doped N+ drain region 306, heavily doped N+ source region 308, and channel region 310 in P type semiconductor body 302. As shown in FIG. 3, OTP device 300 also comprises pass gate 320 including pass gate electrode 322 and pass gate dielectric 324, and programming gate 330 including programming gate electrode 332 and programming gate dielectric 334. OTP device 300 formed in semiconductor body 302 and comprising pass gate 320 and programming gate 330 corresponds to OTP device 100 formed in semiconductor body 102 and comprising pass gate 120 and programming gate 130, in FIG. 1, after application of a programming voltage to programming gate electrode 132, as indicated by rupture 336 through programming gate dielectric 334, in FIG. 3. Also shown in FIG. 3 are bit line contact 316 and word line contact 326, corresponding respectively to bit line contact 116 and word line contact 126, in FIG. 1.

Step 240 of flowchart 200 may be performed through application of a relatively high voltage, such as an approximately 5 volt programming voltage, for example, to programming gate electrode 332, to produce one or more pinhole type rupture(s) 336 in programming gate dielectric 334. In embodiments such as those discussed above, in which programming gate electrode 332 is formed of a gate metal, step 240 results in programming gate electrode 332 making Schottky contact with drain extension region 304. However, due to the relative voltage isolation of pass gate 320 from programming gate 330, resulting from LDMOS structure 301, pass gate dielectric 324 will remain substantially unaffected by the application of the programming voltage causing pinhole type rupture(s) 336 through programming gate dielectric 334.

Figure 4:
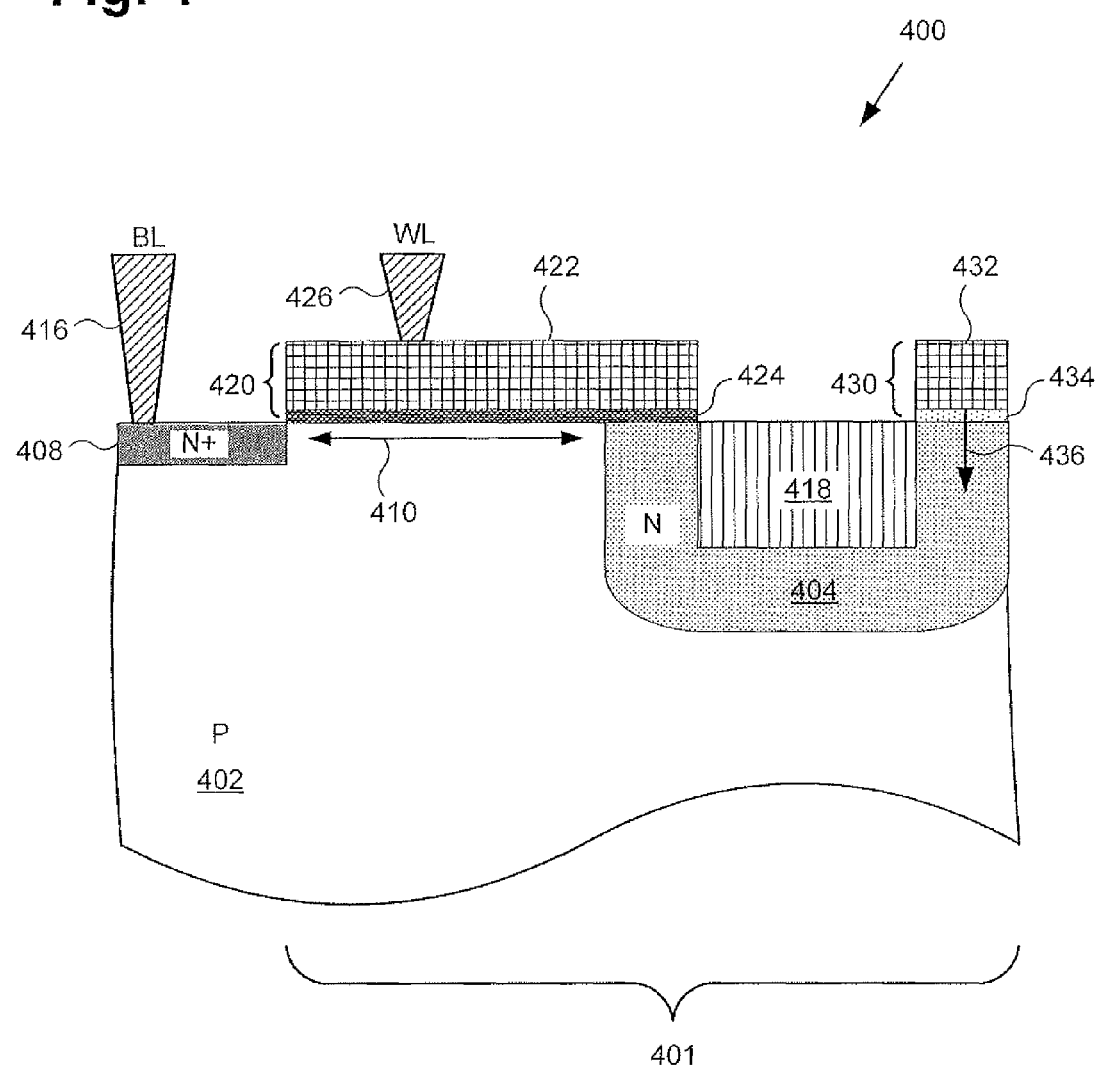
FIG. 4 shows an OTP device having an LDMOS structure, according to another embodiment of the present invention.

Referring now to FIG. 4, FIG. 4 shows a cross-sectional view of OTP device 400 having LDMOS structure 401, according to another embodiment of the present invention. OTP device 400 includes N type drain extension region 404, heavily doped N+ source region 408, and channel region 410 in P type semiconductor body 402. As shown in FIG. 4, OTP device 400 also comprises pass gate 420 including pass gate electrode 422 and pass gate dielectric 424, and programming gate 430 including programming gate electrode 432 and programming gate dielectric 434 through which pinhole type rupture 436 has been formed. OTP device 400 formed in semiconductor body 402 and comprising pass gate 420 and programming gate 430 including rupture 416 corresponds to OTP device 300 formed in semiconductor body 302 and comprising pass gate 320 and programming gate 330 including rupture 336, in FIG. 3. As may be further seen from FIG. 4, rupture 436 through programming gate dielectric 434 results in N type drain extension region 404 being in Schottky contact with programming gate electrode 432, when programming gate 430 is fabricated using a high-κ metal gate process. In addition, FIG. 4 shows bit line contact 416 and word line contact 426, corresponding respectively to bit line contact 316 and word line contact 326, in FIG. 3.

Also shown in FIG. 4 is isolation body 418 between pass gate 420 and programming gate 430, having no analogue in the previous figures. Isolation body 418 may comprise a shallow trench isolation (STI) structure, such as an STI structure formed of silicon oxide ($SiO_2$), for example, and may be formed according to known CMOS fabrication process steps. According to the embodiment shown in FIG. 4, isolation body 418 may be implemented as part of LDMOS structure 401 to provide additional protection for pass gate 420 when the programming voltage for producing rupture 436 is applied to programming gate electrode 432.

Thus, the structures and methods according to the present invention enable several advantages over the conventional art.

For example, by adopting an LDMOS structure, embodiments of the OTP device disclosed by the present application are configured to withstand higher programming voltages than would otherwise be the case, thereby rendering programming more reliable while advantageously providing enhanced protection for a pass gate portion of the OTP device. In addition, a programming gate of embodiments of the disclosed OTP device may be fabricated using a high-κ metal gate process, such that, after programming, a Schottky contact is formed between a programming gate electrode and a drain region of the OTP device, thereby enabling improved conduction in a forward biased state. Moreover, the advantages associated with this approach can be realized using existing high-κ metal gate CMOS process flows, making integration of high voltage devices and CMOS core and IO devices on a common IC efficient and cost effective. As a result, the present invention improves design flexibility without adding cost or complexity to established semiconductor device fabrication processes.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable (OTP) device comprising:
a lateral diffused metal-oxide-semiconductor (LDMOS) structure having a drain extension region;
a pass gate including a pass gate electrode and a pass gate dielectric; and
a programming gate including a programming gate electrode and a programming gate dielectric situated on said drain extension region, said programming gate being spaced from said pass gate by said drain extension region, wherein
the pass gate does not overlap a source region of the OTP device in a vertical direction.

2. The OTP device of claim 1, wherein said pass gate dielectric and said programming gate dielectric comprise a same dielectric material.

3. The OTP device of claim 1, wherein said programming gate electrode and said pass gate electrode comprise a same electrically conductive material.

4. The OTP device of claim 1, wherein said programming gate electrode makes Schottky contact with said drain extension region after an application of a programming voltage to said programming gate electrode.

5. The OTP device of claim 1, wherein said OTP device is an n-channel metal-oxide-semiconductor (NMOS) device.

6. The OTP device of claim 1, wherein said OTP device is a p-channel metal-oxide-semiconductor (PMOS) device.

7. The OTP device of claim 1, wherein said programming gate electrode is formed from a gate metal.

8. The OTP device of claim 1, wherein said programming gate dielectric comprises a high-κ dielectric.

9. The OTP device of claim 1, further comprising an isolation body between said pass gate and said programming gate.

10. The OTP device of claim 9, wherein said isolation body comprises a shallow trench isolation (STI).

11. The OTP device of claim 1, wherein an end of the pass gate electrode is aligned with an end of the pass gate dielectric.

12. A one-time programmable (OTP) device comprising:
a pass gate including a pass gate electrode and a pass gate dielectric; and
a programming gate including a programming gate electrode and a programming gate dielectric, wherein
said programming gate is disposed on a drain extension region of said OTP device to provide protection for said pass gate when a programming voltage for rupturing said programming gate dielectric is applied to said programming gate electrode; and
the pass gate does not overlap a source region of the OTP device in a vertical direction.

13. The OTP device of claim 12, wherein said pass gate dielectric and said programming gate dielectric comprise a same dielectric material.

14. The OTP device of claim 12, wherein said programming gate electrode and said pass gate electrode comprise a same electrically conductive material.

15. The OTP device of claim 12, wherein said programming gate electrode makes Schottky contact with said drain extension region after an application of a programming voltage to said programming gate electrode.

16. The OTP device of claim 12, wherein said OTP device is an n-channel metal-oxide-semiconductor (NMOS) device.

17. The OTP device of claim 12, wherein said OTP device is a p-channel metal-oxide-semiconductor (PMOS) device.

18. The OTP device of claim 12, wherein said programming gate electrode is formed from a gate metal.

19. The CUP device of claim 12, wherein said programming gate dielectric comprises a high-κ dielectric.

20. The OTP device of claim 12, further comprising an isolation body between said pass gate and said programming gate.

21. The OTP device of claim 20, wherein said isolation body comprises a shallow trench isolation (STI).

* * * * *